United States Patent [19]

Towle

[11] 4,028,638
[45] June 7, 1977

[54] STABILIZED CRYSTAL CONTROLLED OSCILLATOR

[75] Inventor: Allistair Towle, Willowdale, Canada

[73] Assignee: U.S. Philips Corporation, New York, N.Y.

[22] Filed: Mar. 15, 1976

[21] Appl. No.: 666,603

[30] Foreign Application Priority Data
Mar. 20, 1975 Canada ............................ 222663

[52] U.S. Cl. ........................ 331/109; 331/116 R; 331/183
[51] Int. Cl.² ........................ H03B 3/02; H03B 5/36
[58] Field of Search .......... 331/109, 116 R, 117 R, 331/183

[56] References Cited
UNITED STATES PATENTS

| 3,665,342 | 5/1972 | Reed | 331/109 |
| 3,979,693 | 9/1976 | Saari | 331/116 R X |

Primary Examiner—Siegfried H. Grimm
Attorney, Agent, or Firm—Frank R. Trifari; Henry I. Steckler

[57] ABSTRACT

The invention relates to an oscillator having a positive feedback amplifier circuit the gain of which is controlled in direct opposite relationship to the amplitude of the oscillatory voltage produced by the oscillator and is especially useful for crystal controlled oscillators. The controlled feedback amplifier comprises a differential amplifier one branch of which feeds a rectifier producing the control voltage and the other branch of which acts as the controlled feedback amplifier.

6 Claims, 1 Drawing Figure

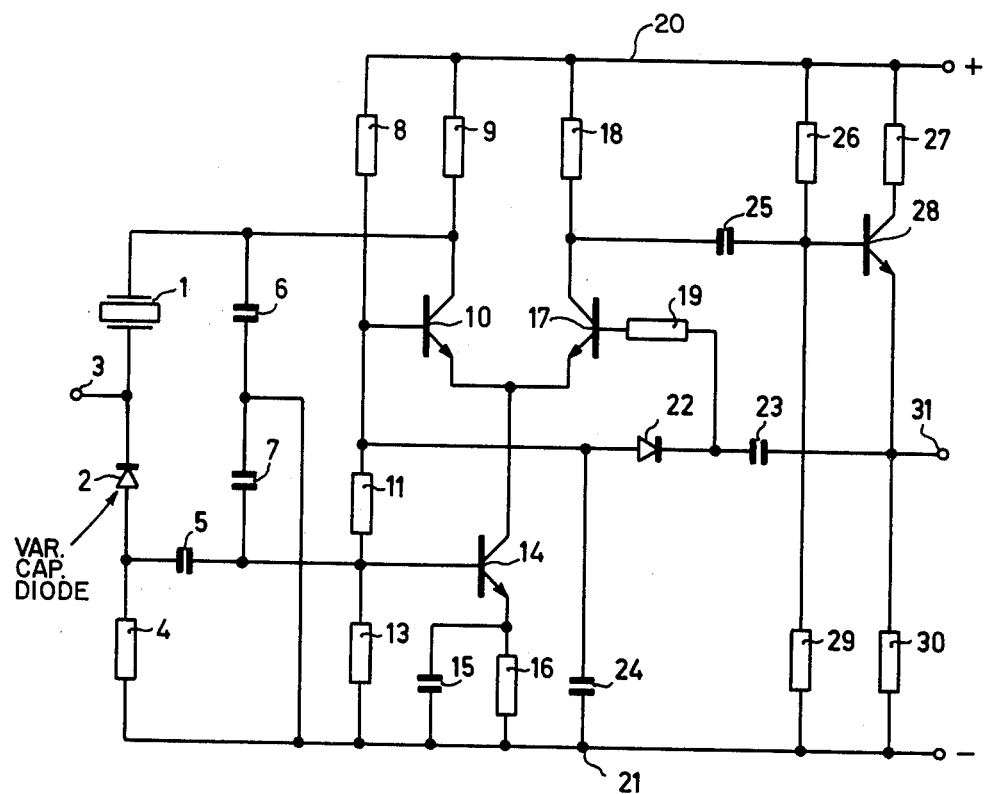

STABILIZED CRYSTAL CONTROLLED OSCILLATOR

This invention relates to stabilized oscillators and in particular to the stabilization of crystal controlled oscillators against short and long term frequency change.

In crystal oscillators spurious coupling of the desired mode of vibration of the crystal to other possible modes, invariably having different temperature coefficients, cause frequency jumps in the frequency versus temperature characteristic of the oscillator. The degree to which these effects appear increase with the drive level of the crystal and accordingly low drive levels are desirable in order to simplify the temperature compensation problem.

In addition ageing of the crystal increases with the drive level or amplitude of vibration and thus long term stability is improved by low drive level.

The stabilization time after turn on is rather important so that it is not necessary to operate the oscillator continuously in order to have ready availability of accurate oscillator frequency and amplitude. Low crystal drive level provides for better turn on stabilization due to the reduction of self heating of the crystal due to its vibration which heating is not easily compensated.

Harmonics due to non-linearities in the oscillator circuit operation produce problems in frequency stability and in purity of the oscillator output signal. Operation of the crystal drive amplifier in a "Class A" linear mode is desirable and in order to maintain power consumption at a minimum operation at a low d.c. level a low oscillation amplitude is highly desirable.

Methods used in the past to control the amplitude of the drive generally employed a d.c. supply voltage variation which consequently changed the operating point of oscillator transistors resulting in poor frequency stability (compare for instance U.S. Pat. No. 3,213,390). In addition, in oscillator circuits designed for operation at low levels, difficulty in obtaining crystal vibration starting have been encountered.

It is therefore an object of this invention to provide a crystal controlled oscillator operating at a very low crystal drive level while operating in "Class A" with a minimum power requirement.

It is a further object of this invention to provide a crystal controlled oscillator operating at a low crystal drive level but a high start up level to ensure quick oscillation start.

A further and most important object of the invention is to provide this amplitude control by a means which has negligible effect on the oscillator frequency.

In accordance with the invention a crystal controlled oscillator, operating at low crystal drive level, is provided with a differential amplifier pair, one amplifying device of the pair supplying the drive (positive feedback) to the control crystal and both devices of the pair being controlled, by oscillator output amplitude, to control the a.c. and d.c. current division of the pair so that the feedback amplifying device supplies high drive to the crystal when no control is present as during start up and a constant low level drive during normal operation. Furthermore the amplifying devices are operated in "Class A" type operation so that non-linearity problems are not introduced with control i.e. the d.c. of the crystal driving amplifier increases or decreases directly with drive (gain).

In a preferred embodiment the differential amplifier comprises two transistors to the emitters of which is fed the oscillatory signal from a circuit which includes the crystal. Preferably a transistor amplifier is connected in series with the common emitter connection of the differential pair to the base electrode of which transistor is fed the oscillatory signal. The collector of one of the pair transistors is coupled in positive feedback arrangement with the oscillatory circuit in a high loop gain arrangement. The collector of the other transistor is coupled to an amplitude detector whereby a differential control (d.c.) voltage is produced and fed back in differential manner to the base electrodes of both pair transistors so that with increasing oscillatory signal amplitude the gain of the feedback transistor is decreased and that of the other pair transistor increased.

The differential control of the transistors provides a high loop gain for oscillator start up and low level crystal drive for normal operation. The direct current level in the pair transistors, in particular the feedback transistor is controlled to a value whereat class A or equivalent operation takes place at all control voltage levels.

Operation of the transistor in the common emitter circuit of the pair is at a constant current, regardless of the level of control required, which constant current is divided between the transistors of the common emitter pair according to the relation control voltages applied to the transistors of the pair. Due to the fact the transistor in the common emitter circuit operates at a constant current (d.c.) or at a fixed operating point, and further that the collector load thereof, represented by the emitter impedances of the pair transistors, is very low, a minimal and substantially constant phase shift is achieved which does not change with current division in the transistor pair. It will thus be seen that frequency shift with level control will be substantially eliminated in comparison to prior art systems, wherein, in such systems, adjustment of the operating point of the feedback transistor changed the phase of the signal being fed back to the oscillatory circuit, i.e. the crystal circuit per se, with consequent change in operating frequency.

In addition an advantage is gained in the present circuit in that supply voltage changes do not greatly effect frequency of operation because of the low voltage gain of the transistor in the common emitter circuit of the pair — essentially a "cascode" amplifier arrangement which does not require neutralization due to the low inherent feedback of the system.

In addition due to the overall feedback of the amplitude control system ensuring operation at a minimum signal level a very linear operation is achieved.

The invention will now be described in greater detail with reference to the single FIGURE of the drawing which shows the preferred embodiment thereof.

Referring now to the drawing, a differential amplifier arrangement is shown comprising transistors 10, 17 having their emitters connected in common through a third transistor 14 provided with an emitter biasing arrangement of capacitor 15 and resistor 16. Collector load resistors 9, 18 are provided for transistors 10, 17 respectively. Biasing voltages for transistors 10, 17 and 14 are supplied by resistive bleeder network 8, 11, 13. The base electrodes of transistors 10, 17 are at a.c. reference potential by virtue of capacitor 24 which performs a dual function which will be referred to subsequently.

The oscillator circuit per se including transistors 10, 14 is of the Colpitts type with capacitors 6, 7 supplying the split capacity. The common terminal of capacitors 6, 7 is at the reference potential or a.c. ground for the base electrode of transistor 10. The inductive reactance of the tuned circuit of the oscillator is comprised by a crystal 1 which is connected in series with a voltage sensitive capacitor 2 and a further capacitor 5, elements 1, 2 and 5 being connected in parallel with capacitors 6, 7. A resistor 4 is connected between the junction of capacitors 2 and 5 so that a direct current reference potential is applied to one terminal of capacitor 2. A control voltage from a temperature compensating network, not shown, may be applied to terminal 3 to add improved temperature stability.

The collector of transistor 17 is connected through a capacitor 25 to the base electrode of a transistor buffer — amplifier 28. Appropriate base bias is supplied by bleeder network 26, 29. A collector current limiting resistor 27 connects to a voltage supply line 20. The output of the buffer amplifier, developed across emitter resistor 30, is available at the emitter of transistor 28 or output terminal 31. The buffer output is also supplied through a capacitor 23 to a rectifier 22 and to a resistor 19 which is connected to the base electrode of transistor 17. Rectifier 22, when fed an a.c. signal from the buffer amplifier 28 is effective to produce a negative voltage at its junction with capacitor 24 and a positive voltage at its junction with capacitor 23.

In operation, and before start of oscillation, capacitors 23 and 24 are charged to a voltage, positive with respect to reference potential, by virtue of bleeder 8, 11, 13 and diode 22. The forward bias on transistors 10, 17 and their quiescent d.c. currents are determined by this positive voltage with respect to that at the collector of transistor 14. The quiescent currents of tranistors 10, 17, since they are similarly biassed, will be similar so that a considerable portion of the total quiescent current (usually about ½) flows through transistor 10 thus providing a high forward loop gain for oscillation start up.

When oscillation starts, the oscillatory signal is fed through transistor 14 to the differential amplifiers 10, 17. The high initial collector current of transistor 10 ensures a quick build up of oscillation.

The oscillatory voltage amplified by transistor 17 is fed to transistor 28, wherefrom it is supplied to rectifier system 22, 23, 24 to produce a decreasing control voltage at the base electrode of transistor 10 and an increasing voltage at the base electrode of transistor 17. The collector current of transistor 10 decreases reducing the positive feedback to the oscillatory circuit incorporating the crystal, while the collector current of transistor 17 increases resulting in a further reduction of the collector current of transistor 10 and corresponding increase in the collector current of transistor 17, which is accumulative until a point is reached whereat the drive to the crystal is reduced to a value such that oscillation is just maintained and held constant by the overall degenerative effect which comes into play at this point in the operation of the oscillator circuit.

Modifications of the invention described, which do not depart from the spirit and scope thereof, may now become apparent apart from the embodiment described herein and which modifications are covered by the appended claims. For instance the invention can be utilized for controlling the oscillation amplitude of an oscillator not provided with a frequency controlling crystal device.

What is claimed is:

1. An oscillator comprising a first transistor amplifier, a tuned resonant circuit means for feeding an oscillatory voltage to said first transistor amplifier, said amplifier having a low impedance load circuit including a pair of transistors coupled in differential amplifier arrangement, the transistors of the pair having a common emitter circuit, one of said pair of transistors being coupled to feed amplified oscillatory voltage back to said resonant circuit to maintain oscillation therein, a rectifier system, the other of said pair of transistors being coupled for feeding amplified oscillatory voltage to said rectifier system to produce a pair of opposed direct current control voltages, and means to supply said direct current control voltages to the control electrodes of the pair of transistors with such polarity as to reduce the conductivity of said one transistor of the pair and increase the conductivity of the other transistor of said pair.

2. In an oscillator as claimed in claim 1 wherein the resonant circuit comprises a frequency controlling crystal.

3. In an oscillator as claimed in claim 1 wherein said first transistor is coupled in series in the common emitter circuit of the differential amplifier.

4. In an oscillator as claimed in claim 2, wherein said first transistor is coupled in series in the common emitter circuit of the differential amplifier.

5. An oscillator comprising, a first transistor amplifier, a tuned resonant circuit including a crystal frequency controlling element coupled to supply an oscillatory voltage to said first transistor amplifier, a pair of transistors coupled in a differential amplifier arrangement having a common emitter circuit coupled in series with the collector emitter circuit of said first transistor amplifier, wherein the common emitter circuit comprises the collector load of the first amplifier, the collector output circuit of one transistor of the pair being coupled to supply amplified oscillatory voltage to the resonant circuit to maintain oscillation therein, a signal rectifier system, the other transistor of the pair supplying amplified oscillatory voltage to said signal rectifier system to produce a pair of opposed direct current voltages, one of the voltages being applied to the one transistor of the pair to reduce the conductivity thereof and the other direct current voltage being applied to the other transistor of the pair to increase the conductivity thereof, whereby a minimum amplitude of oscillatory voltage is maintained in the resonant circuit.

6. In an oscillator as claimed in claim 5 wherein the signal rectifier comprises a buffer amplifier from which an output signal may be obtained without a loading effect on the oscillator.

* * * * *